United States Patent [19]

Patel et al.

[11] Patent Number: 6,139,079

[45] Date of Patent: *Oct. 31, 2000

[54] UNIVERSAL TRANSPORT APPARATUS

[75] Inventors: Dilip Patel, Mesa; Jeffrey A. Miks, Chandler; Dwight L. Daniels, Mesa, all of Ariz.

[73] Assignee: Motorola, Inc., Schaumburg, Ill.

[ * ] Notice: This patent issued on a continued prosecution application filed under 37 CFR 1.53(d), and is subject to the twenty year patent term provisions of 35 U.S.C. 154(a)(2).

[21] Appl. No.: 08/954,241

[22] Filed: Oct. 20, 1997

[51] Int. Cl.[7] ................................. B05C 1/00; B23K 3/06
[52] U.S. Cl. .......................... 294/87.1; 118/213; 228/39; 294/64.1
[58] Field of Search .............................. 294/64.1, 65, 1.1, 294/61, 87.1; 29/743, 729, 739, 740, 760; 269/21; 279/3; 118/213, 406, 425, 500, 502, 503; 427/96, 256; 228/33, 35, 39, 179.1, 180.1, 180.21, 246, 254

[56] References Cited

U.S. PATENT DOCUMENTS

| | | | |
|---|---|---|---|
| 2,964,007 | 12/1960 | Buffington | 228/39 |
| 3,226,255 | 12/1965 | Cieniewicz et al. | 118/213 |
| 3,910,621 | 10/1975 | Hillier | 294/64.1 |
| 4,506,820 | 3/1985 | Brucker | 228/39 |
| 4,739,919 | 4/1988 | Van Den Brekel et al. | 228/39 X |
| 4,745,679 | 5/1988 | Shinano et al. | 29/741 |
| 4,787,662 | 11/1988 | Dewez | 294/65 X |
| 4,881,770 | 11/1989 | Marzinotto et al. | 294/64.1 |
| 5,284,287 | 2/1994 | Wilson et al. | 294/64.1 X |
| 5,749,614 | 5/1998 | Reid et al. | 294/64.1 |
| 5,834,062 | 11/1998 | Johnson et al. | 228/33 X |
| 5,839,641 | 11/1998 | Teng | 118/213 X |

FOREIGN PATENT DOCUMENTS

| | | | |
|---|---|---|---|
| 3208864 | 9/1983 | Germany | 269/21 |
| 102848 | 5/1988 | Japan | 269/21 |
| 1207586 | 1/1986 | U.S.S.R. | 269/21 |
| 2120141 | 11/1983 | United Kingdom | 269/21 |
| 2168915 | 7/1986 | United Kingdom | 269/21 |
| 10336 | 6/1992 | WIPO | 269/21 |

*Primary Examiner*—Johnny D. Cherry
*Attorney, Agent, or Firm*—Lanny L. Parker

[57] ABSTRACT

A transport head (10) and a method for transporting flux and solder balls (50) to locations for bonding pads (46) on a workpiece (44). To transfer flux, a first pattern definition mask (12) is attached to the transport head (10) and allows selector pins (64) to fully extend and receive flux for transport to the bonding pads (46) on the substrate (44). To transfer the solder balls (50), pattern definition mask (12) attached to the transport head (10) defines locations that are to be populated with the solder balls (50). The transport head (10) transfers the solder balls (50) to the bonding pads (46) of the substrate (44).

3 Claims, 4 Drawing Sheets

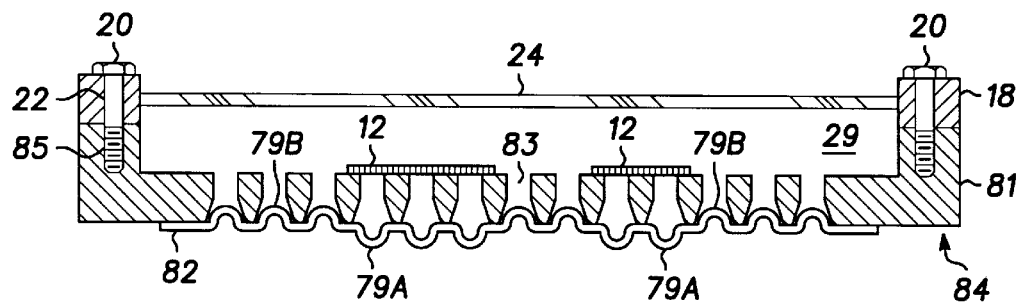
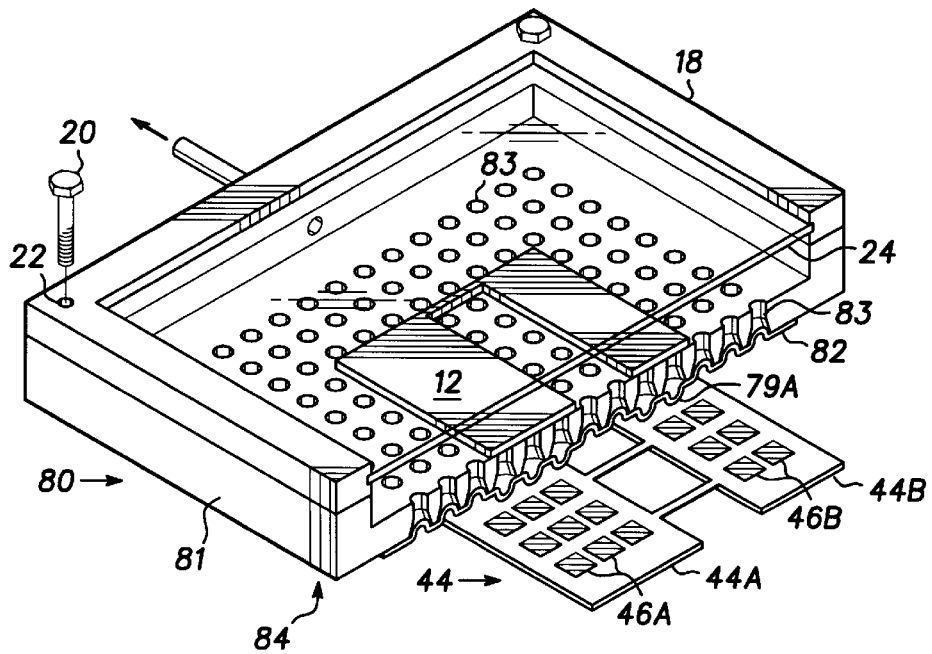

UNIVERSAL TRANSPORT APPARATUS

BACKGROUND OF THE INVENTION

The present invention relates, in general, to transport mechanisms and, more particularly, to mechanisms for transporting materials used in manufacturing semiconductor devices.

An important aspect in manufacturing semiconductor devices is transporting components from a holding area to the semiconductor device during the assembly process. For example, a step in the assembly of Ball Grid Array (BGA) packages involves moving flux from a reservoir to the bond pads of the BGA package. Another assembly step involves moving solder balls from a bin and placing them on the bond pads.

Typically, each design of a BGA package requires a dedicated transport tool for moving flux from the reservoir to bond pad locations formed on a substrate. Different package designs can have distinct pitch dimensions or separations between bond pad locations. In addition, different package designs can have a differing number of bond pads. Thus, a dedicated transport tool is required for each BGA package design. Similarly, each BGA package design requires a dedicated transport tool for moving solder balls from the bin to bond pad locations. Thus, different transport tools are needed to handle substrates having variations in pitch dimensions between bond pad locations as well as substrates having differing numbers of bond pads.

Accordingly, it would be advantageous to have a method and apparatus for transporting flux, solder balls, or other components that are inexpensive and reduce cycle time. It would be of further advantage for the transport tool to facilitate automation of the package assembly process and be easily changeable to accommodate new BGA package designs.

BRIEF DESCRIPTION OF THE DRAWINGS

FIG. 7 is a cross-sectional side view of a flux transport head in accordance with a fifth embodiment of the present invention; and FIG. 8 illustrates a partial cross-sectional isometric view of the flux transport head of FIG. 7 and a workpiece.

DETAILED DESCRIPTION OF THE DRAWINGS

Generally, the present invention provides a transport tool and a method for transporting flux and solder balls to bond pad locations on a substrate of a semiconductor device. More particularly, the present invention provides a transport head and a mask that can accommodate semiconductor devices of various sizes and having differing Input/Output (I/O) pin counts. In accordance with one aspect of the present invention, the mask in the transport head defines the portions of the semiconductor device that receive a flux material. In accordance with another aspect of the present invention, another mask in the transport head defines the portions of the semiconductor device that are populated with solder balls. The transport tool is suitable for use in the assembly process for Ball Grid Arrays (BGAs), Glob Top Arrays (GTAs), Pin Grid Arrays (PGAs), and the like. The transport tool and corresponding set of masks can accommodate a variety of semiconductor devices and reduce package tooling costs and package development cycle times. In yet another aspect of the present invention, a workpiece such as a substrate is provided having bonding pads on a first portion separated from each other by a fixed pitch and bonding pads on a second portion separated from each other by a fixed pitch. The distance between the bonding pads of the first and second portions is an integer multiple of the fixed pitch of either the first or the second portions.

Figure 1:
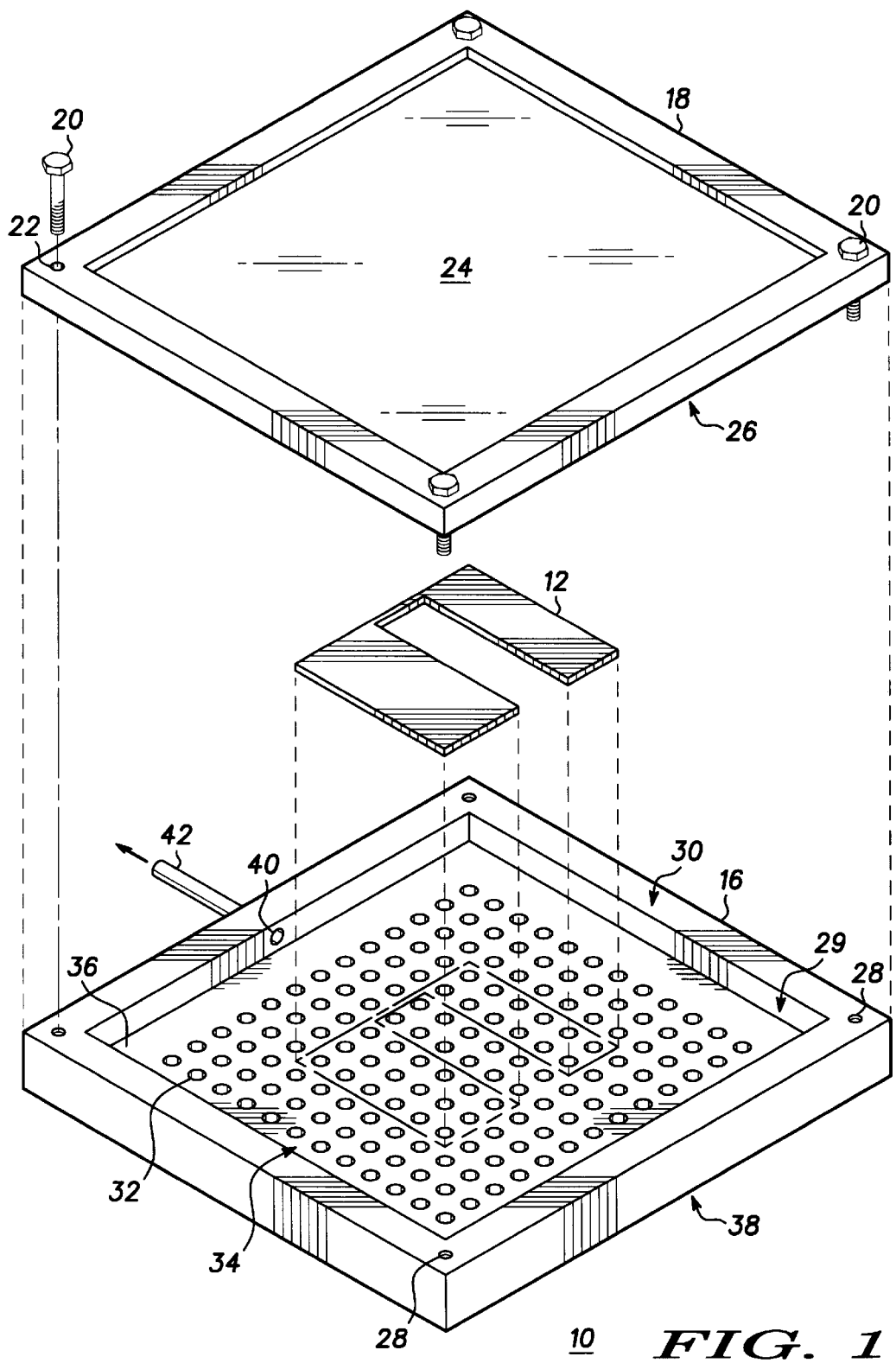
FIG. 1 is an exploded isometric view of a transport head having a pattern definition mask within a vacuum chamber in accordance with the present invention.

FIG. 1 is an exploded isometric view of a transport head 10 having a pattern definition mask 12 secured within a recessed area 29 in accordance with the present invention. Pattern definition mask 12 is also referred to as a configurable aperture selector. Transport head 10 is also referred to as a universal transport apparatus and includes a bottom plate 16 and a top plate 18. Apertures or holes 22 extend through top plate 18. A threaded bolt 20 is inserted in each hole 22 and screwed into a corresponding threaded hole 28 within bottom plate 16. Thus, top plate 18 is fixably attached to bottom plate 16 by threaded bolts 20. Alternatively, a clamping mechanism (not shown) could be used to secure top plate 18 to bottom plate 16.

By way of example, top plate 18 is rectangularly shaped and has a central portion that is preferably formed from a translucent or clear material 24. Typically, top plate 18 is an aluminum plate and clear material 24 is made of Plexiglas. It should be noted that the type of materials used for top plate 18 or clear material 24 are not limitations of the present invention. In other words, top plate 18 could be made from a variety of materials such as, for example, ceramics, plastics, resins, acrylics, or the like.

Bottom plate 16 has a top surface 30 and a bottom surface 38. Threaded holes 28 are machined or formed in bottom plate 16 and aligned with holes 22 in top plate 18 so that threaded bolts 20 inserted into holes 22 are received by threaded holes 28. Thus, threaded bolts 20 securely mate bottom surface 26 of top plate 18 with top surface 30 of bottom plate 16. In addition, bottom plate 16 has a recessed area 29 formed therein. Recessed area 29 is formed in a central portion of bottom plate 16 and is referred to as a cavity or a chamber. Recessed area 29 has a top recessed surface 36. Preferably, bottom plate 16 and top plate 18 are manufactured from the same material. Although recessed area 29 is shown as formed in bottom plate 16, it could be formed in top plate 18, or partially formed in both bottom plate 16 and top plate 18.

In a first embodiment of transport head 10, a plurality of holes 32 are drilled or formed in recessed area 29 of bottom plate 16. Holes 32 extend from top recessed surface 36 to a bottom surface 38 of bottom plate 16. Holes 32 are arranged in an M by N array 34, where M is the number of rows and N is the number of columns of array 34. By way of example, holes 32 are circularly shaped and each hole 32 has a diameter that is approximately one half the diameter of the material being transported. It should be noted that the shape of holes 32 is not a limitation of the present invention. It should be further noted that holes 32 may or may not be flared along bottom surface 38 of bottom plate 16. Preferably, the center of one hole 32 is spaced apart from the center of an adjacent hole 32 by about one millimeter. It should be understood that the two adjacent holes may be located in the same row or the same column of array 34, i.e., holes 32 have a pitch of about one millimeter. The pitch of holes 32 is not limited to one millimeter. For simplicity of illustration, array 34 is arranged as a twelve by thirteen array. It should be noted that the size of array 34 is not intended as a limitation of the present invention.

Pattern definition mask 12 is placed on top recessed surface 36 and designed to cover a user defined number and pattern of holes 32. Although pattern definition mask 12 is shown as a rectangularly shaped mask, it can have other shapes that cover any hole 32 or plurality of holes 32 within array 34. Pattern definition mask 12 can be made from a number of materials such as, for example, plastic, metal, rubber, etc. By way of example, pattern definition mask 12 is fixed to top recessed surface 36 of bottom plate 16 by a pliable adhesive (not shown). Alternatively, pattern definition mask 12 could be held to top recessed surface 36 of bottom plate 16 by a fastener, a clamp, or a press fit. Thus, a first pattern definition mask 12 can be attached to top recessed surface 36 to cover specific holes 32 within array 34. Then, a second definition mask having a different pattern that covers different holes 32 within array 34 could replace the first pattern definition mask 12 and be attached to top recessed surface 36. In other words, transport head 10 can be used in an assembly process for a variety of semiconductor devices by the substitution of different pattern definition masks.

In addition, bottom plate 16 has a hole 40 extending through a side of bottom plate 16. A hose 42 is attached to a portion of hole 40 outside of recessed area 29. Top plate 18 is fastened to bottom plate 16, and then a vacuum pump (not shown) is attached to hose 42 and an air pressure within recessed area 29 is reduced. In other words, air flow is generated by the vacuum pump causing air from outside transport head 10 to flow through holes 32 that are not covered by pattern definition mask 12 and into recessed area 29. The air in recessed area 29 is then removed by the vacuum pump.

Figure 2:
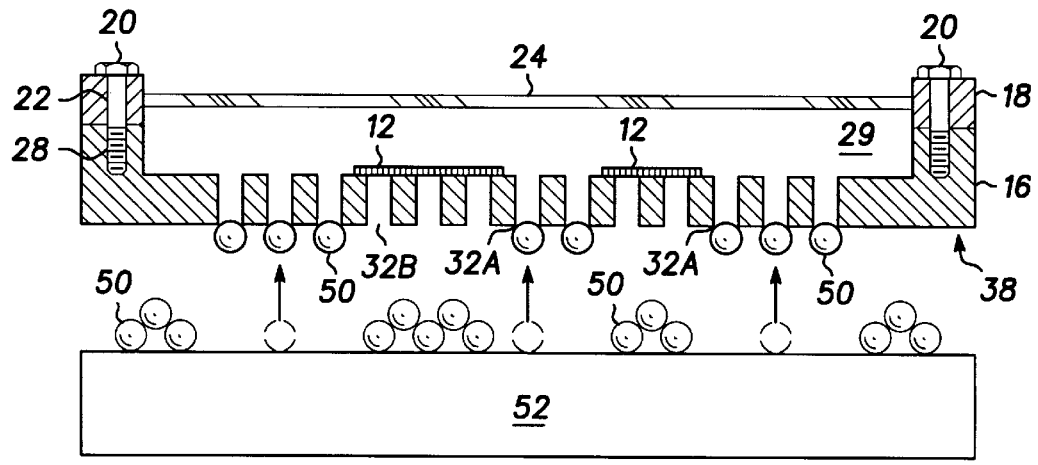
FIG. 2 is a cross-sectional side view of a transport head having a masking plate inside the vacuum chamber as illustrated in FIG. 1.

FIG. 2 is a cross-sectional side view of transport head 10 having pattern definition mask 12 inside recessed area 29 as shown in FIG. 1. It should be noted that the same reference numbers are used in the figures to denote the same elements. Top plate 18 is shown secured to bottom plate 16 by threaded bolts 20, which extend through holes 22 in top plate 18 and into threaded holes 28 in bottom plate 16.

Figure 3:
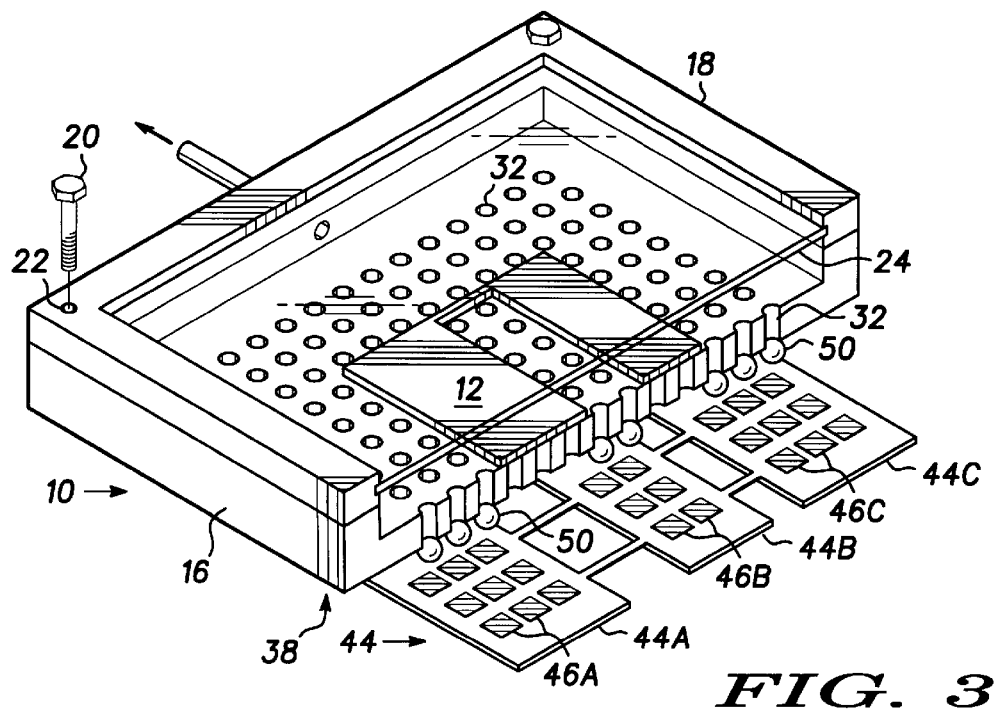
FIG. 3 illustrates a partial cross-sectional isometric view of the transport head of FIG. 2 and a workpiece.

In operation, transport head 10 is typically positioned over a solder ball bin 52 containing solder balls 50. Alternatively, transport head 10 could pick-up solder balls 50 arranged in a predefined pattern. In addition, objects other than solder balls 50 such as, for example, conductive expoxy, could be transported by transport head 10. Referring to FIGS. 1 and 2, the vacuum pump (not shown) attached to hose 42 causes air to flow into recessed area 29 through holes 32A. The letter "A" has been appended to reference number 32 to show holes 32 that are not covered by pattern definition mask 12. Pattern definition mask 12 blocks air from flowing into recessed area 29 through holes 32B. The letter "B" has been appended to reference number 32 to show holes 32 that are covered by pattern definition mask 12. Solder balls 50 are sucked up from solder ball bin 52 by the vacuum at the location of holes 32A. Solder balls 50 are not sucked up at the locations for holes 32B because pattern definition mask 12 blocks holes 32B. Thus, a particular pattern of solder balls as defined by pattern definition mask 12 in transport head 10 is held at bottom surface 38. A vacuum is formed in recessed area 29 when holes 32A are covered. Following the population of holes 32A with solder balls 50, transport head 10 is moved to a workpiece such as, for example, a substrate 44 (FIG. 3). Solder balls 50 are then deposited onto substrate 44 by releasing the vacuum. In this embodiment, transport head 10 is a holding structure and referred to as a transport solder ball head.

FIG. 3 illustrates a partial cross-sectional isometric view of transport head 10 of FIG. 2 and a substrate 44. FIG. 3 shows solder balls 50 that are held by vacuum and contact bottom surface 38 at locations determined by pattern definition mask 12. Top plate 18 is shown secured to bottom plate 16 by threaded bolts 20 extending through holes 22 in top plate 18 and being threaded into threaded holes 28 in bottom plate 16. Substrate 44 includes a plurality of bonding pads 46A, 46B, and 46C formed on a surface of substrate 44. The letters "A", "B", and "C" have been appended to reference number 44 to indicate segments 44A, 44B, and 44C of substrate 44. In other words, substrate 44 is comprised of a number of connected substrates 44A, 44B, and 44C that can be singulated. It should be noted that the number of individual substrates contained in substrate 44 is not intended as a limitation of the present invention. It should be further noted that substrates 44A, 44B, and 44C can be arranged on substrate 44 in any pattern including an array of segmented substrates 44A, 44B, and 44C; L shape; or the like. In addition, the letter "A" has been appended to reference number 46 to indicate bonding pads 46A that are formed on substrate 44A. The letter "B" has been appended to reference number 46 to indicate bonding pads 46B that are formed on substrate 44B. The letter "C" has been appended to reference number 46 to indicate bonding pads 46C that are formed on substrate 44C. Bonding pads 46A, 46B, and 46C can be formed having a variety of shapes such as, for, example, circular, rectangular, etc. Bonding pads 46A, 46B, and 46C are also referred to as attach sites.

Bonding pads 46A located along a row have a fixed pitch. In other words, the distance from the center of a bonding pad 46A to the center of an adjacent bonding pad 46A is a fixed distance. Likewise, adjacent bonding pads 46B located along a row are separated from each other by a fixed pitch of, for example, one millimeter. Also, adjacent bonding pads 46C located along a row are separated from each other by a fixed pitch of one millimeter. It should be noted that holes 32 in array 34 of transport head 10 as well as bonding pads 46A, 46B, and 46C on substrate 44 all have a fixed pitch of one millimeter. It should be further noted that bonding pads 46A that are adjacent to bonding pads 46B are sets of bonding pads separated by the fixed pitch distance or by a value equal to the product of an integer multiple and the pitch distance. Likewise, bonding pads 46B that are located adjacent to bonding pads 46C are separated from each other by a distance of one millimeter or by a value equal to the product of an integer constant and the pitch distance. Bonding pads 46A can be separated from bonding pads 46B by distances other than one millimeter, e.g., two millimeters, three millimeters, etc. Thus, pattern definition mask 12 defines holes 32A (FIG. 2) that hold solder balls 50 for deposit on respective bonding pads 46A, 46B, and 46C of substrates 44A, 44B, and 44C.

Figure 4:
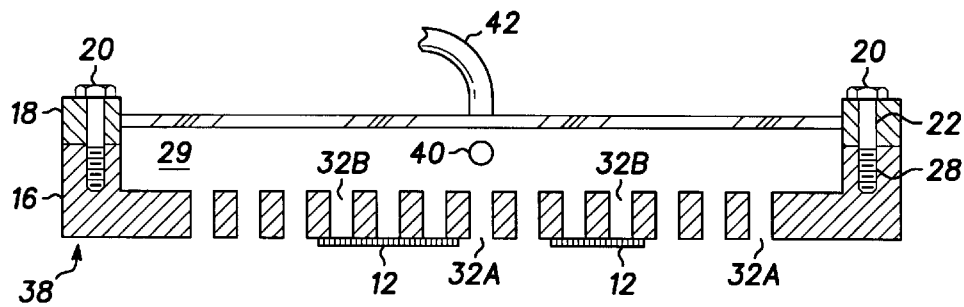
FIG. 4 is a cross-sectional side view of the transport head having the pattern definition mask located outside the recessed area in accordance with a second embodiment of the present invention.

FIG. 4 is a cross-sectional side view of transport head 10 having pattern definition mask 12 outside recessed area 29 in accordance with a second embodiment of the present invention. Top plate 18 is shown secured to bottom plate 16 by threaded bolts 20, which extend through holes 22 in top plate 18 and into threaded holes 28 in bottom plate 16. In the second embodiment, pattern definition mask 12 is not mounted within recessed cavity 29. Instead, pattern definition mask 12 is attached (not shown) to bottom surface 38 of transport head 10 by a mechanical clamp, an adhesive, a press fit, etc.

A hose 42 is attached to hole 40 of bottom plate 16. Top plate 18 is fastened to bottom plate 16, and then a vacuum pump (not shown) is attached to hose 42. Air flow is generated by the vacuum pump causing air from outside transport head 10 to flow into recessed area 29 through holes 32 that are not covered by pattern definition mask 12. The air is then removed through hole 40 by the vacuum pump.

In operation, transport head 10 is positioned over a solder ball bin 52 containing solder balls 50 (FIG. 2). The vacuum pump attached to hose 42 causes air to flow into recessed area 29 through holes 32A. Similar to FIGS. 1 and 2 where pattern definition mask 12 is located inside recessed area 29, pattern definition mask 12 located outside recessed area 29 blocks air from flowing through holes 32B. The letters "A" and "B" have been appended to reference number 32 to show holes through which air can and can not flow, respectively. Air flows through holes 32A forcing solder balls 50 to cover holes 32A at bottom surface 38. On the other hand, air does not flow through holes 32B and solder balls 50 are not sucked up to bottom surface 38 and therefore do not cover holes 32B. Thus, pattern definition mask 12 defines a particular pattern for holding solder balls 50 at bottom surface 38 of transport head 10. Transport head 10 can be positioned above a workpiece such as substrate 44 of FIG. 3 and the pattern of solder balls 50 deposited on respective bonding pads 46A, 46B, and 46C of substrates 44A, 44B, and 44C.

Figure 5:
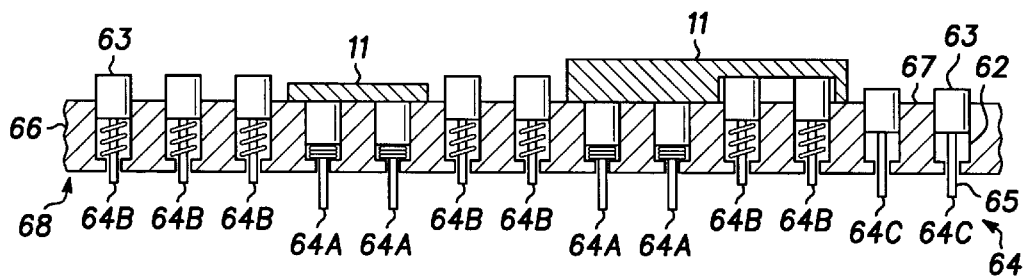
FIG. 5 is a cross-sectional side view of a portion of the transport flux head that includes a plurality of selector pins in accordance with a third embodiment of the present invention.

FIG. 5 is a cross-sectional side view of a portion of a transport flux head 61 that includes a plurality of selector pins 64 in accordance with a third embodiment of the present invention. Transport flux head 61 can be used to transport a liquid material such as, for example, ink used for providing markings for identifying a semiconductor package. Bottom plate 66 includes a top surface 67 and a bottom surface 68. Transport head 10 as illustrated in FIG. 1 can be converted into a transport flux head such as transport flux head 61. The conversion includes forming a plurality of countersink holes 62 containing selector pins 64 in bottom plate 66. In the embodiment of FIG. 5, countersink holes 62 extend from top recessed surface 67 to bottom surface 68 of bottom plate 66. Countersink holes 62 include a counterbore which enlarges a portion of each countersink hole 62 closest to top recessed surface 67.

FIG. 5 illustrates spring-loaded selector pins 64 having reference numbers 64A and 64B that are inserted into countersink holes 62. Selector pins 64 are also referred to as transport selection mechanisms or pogo pins. Selector pins 64 include a body 63 and an extender rod 65. Body 63 of selector pin 64 fits into the countersink portion of countersink hole 62. Extender rod 65 in countersink hole 62 protrudes below bottom surface 68 of bottom plate 66. The letter "A" has been appended to reference number 64 to show a subset of selector pins 64A from the plurality of spring-loaded selector pins 64 that are extended. In FIG. 5, the springs of selector pins 64A are compressed and body 63 is pushed into countersink hole 62 by pattern definition mask 11. Pattern definition mask 11 fits flush with the portion of top recessed surface 67 of bottom plate 66 above selector pins 64A. In this embodiment, pattern definition mask 11 is also referred to as an actuator. Thus, the springs of selector pins 64A are compressed by the force of pattern definition mask 11 on the top of selector pins 64A. The tips of extender rods 65 of selector pins 64A protrude below bottom surface 68 of bottom plate 66 and are co-planar. Co-planar means that the tips of all extender rods 65 of selector pins 64A are substantially in the same plane. Controlled depths for countersink holes 62 in bottom plate 66 and uniform selector pins 64 provide the desired co-planarity of selector pins 64A.

The letter "B" has been appended to reference number 64 to show springs of selector pins 64B not compressed into countersink hole 62. The springs of selector pins 64B are not compressed because the portion of pattern definition mask 11 that is directly above selector pins 64B is not flush with top recessed surface 67 of bottom plate 66. Alternatively, pattern definition mask 11 does not cover selector pins 64B and selector pins 64B are not compressed. The spring tension of the uncompressed springs of selector pins 64B keeps the tips of extender rods 65 for selector pins 64B from protruding further below bottom surface 68 than the tips of extender rods 65 for selector pins 64A.

In operation, the tips of extender rods 65 of selector pins 64A are extended to be below the tips of extender rods 65 of selector pins 64B. Transport flux head 61 can be lowered into a reservoir of flux (not shown) until the tips of extender rods 65 of selector pins 64A are coated with flux. Flux remains on the tips of extender rods 65 of selector pins 64A when transport flux head 61 is removed from the reservoir of flux material. The tips of extender rods 65 of selector pins 64B are not coated with flux and only selector pins 64A transport flux to substrate 44 (FIG. 3).

In addition, FIG. 5 illustrates selector pins 64C that are inserted into countersink holes 62. The letter "C" has been appended to reference number 64 to show that selector pins 64C are not spring loaded. Selector pins 64C are constrained by pattern definition mask 11 to be within countersink holes 62 and have extender rods 65 that hold flux for transfer to substrate 44. Selector pins 64C that are not constrained by pattern definition mask 11 may or may not hold flux for transfer to substrate 44.

Alternatively, pattern definition mask 11 could be removed from surface 67 and placed against bottom surface 68 of transport head 61 (not shown). Pattern definition mask 11 has open portions and closed portions. The open portions of pattern definition mask 11 allow extender rods 65 of selector pins 64A to protrude below bottom surface 68. On the other hand, extender rods 65 of selector pins 64B are prevented from protruding below bottom surface 68 where pattern definition mask 11 is solid or closed, i.e., the portions of pattern definition mask 11 that do not have holes. Thus, only the tips of extender rods 65 of selector pins 64A that protrude through pattern definition mask 11 are coated with flux, which is then transported to a workpiece such as substrate 44 of FIG. 3.

Figure 6:
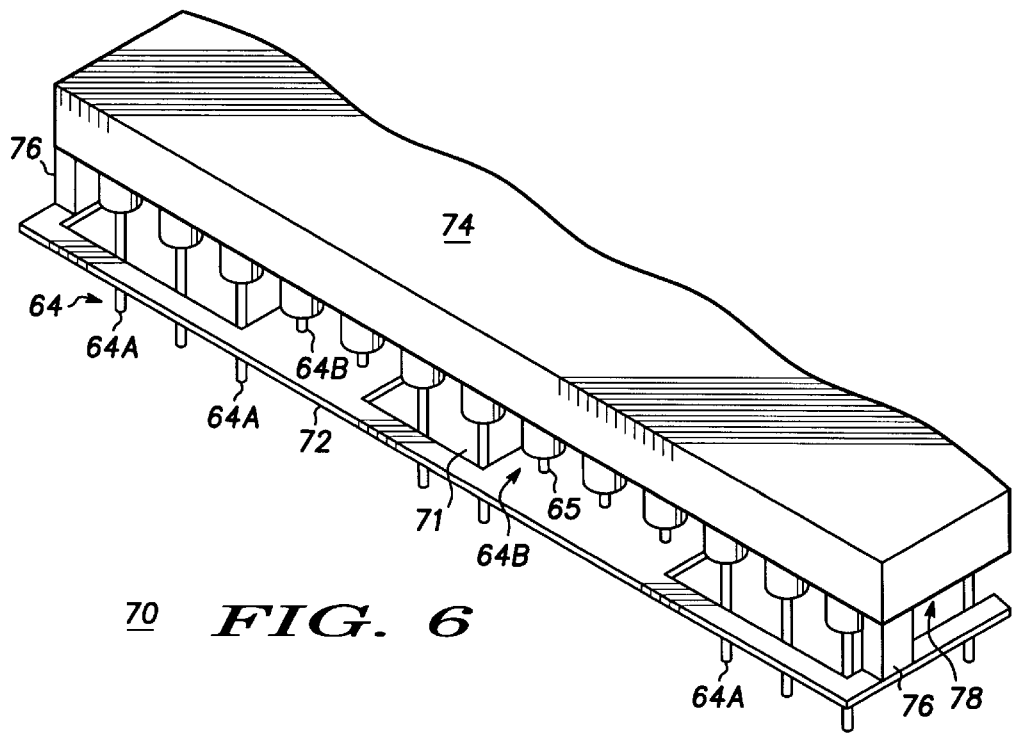
FIG. 6 is a cross-sectional side view of a transport flux head having the pattern definition mask offset from the transport plate in accordance with a fourth embodiment of the present invention.

FIG. 6 is a cross-sectional side view of a transport head 70 having a pattern definition mask 72 offset from a transport plate 74 by a standoff 76 in accordance with a fourth embodiment of the present invention. Selector pins 64 are attached to a bottom surface 78 of transport head 70. Preferably, selector pins 64 are arranged as an M by N array, wherein M is the number of rows and N is the number of columns. For simplicity of illustration, two rows of the array are shown. It should be noted that the size of the array is not intended as a limitation of the present invention.

Pattern definition mask 72 has openings 71 that allow extender rods 65 of selector pins 64A to protrude below pattern definition mask 72. The letter "A" has been appended to reference number 64 to show a subset of selector pins 64A that are fully extended. On the other hand, extender rods 65 of selector pins 64B are prevented from protruding below pattern definition mask 72 where pattern definition mask 72 does not have openings 71. The letter "B" has been appended to reference number 64 to identify a subset 64B of selector pins 64 that are not fully extended. Thus, the tips of extender rods 65 of selector pins 64A are extended further from bottom surface 78 than the tips of extender rods 65 of selector pins 64B. The tips of extender rods 65 of selector pins 64A protrude through pattern definition mask 72 and can be coated with flux when the tips are dipped in a flux reservoir. Only selector pins 64A transport flux to a workpiece such as substrate 44 of FIG. 3.

FIG. 7 is a cross-sectional side view of a flux transport head 80 in accordance with a fifth embodiment of the present invention. Flux transport head 80 has a top plate 18 that is shown secured to bottom plate 81 by threaded bolts 20, which extend through holes 22 in top plate 18 and into threaded holes 85 in bottom plate 81. Recessed area 29 is formed in a central portion of flux transport head 80 and covered by a translucent or clear material 24. Typically, top plate 18 and bottom plate 81 are aluminum plates and clear material 24 is made of Plexiglas. A plurality of holes 83 are formed in bottom plate 81 and extend from recessed area 29 to bottom surface 84 of bottom plate 81. For simplicity of illustration, thirteen holes 83 are shown. It should be noted that the number of holes 83 is not intended as a limitation of the present invention. It should be further noted that holes 83 may or may not be flared along bottom surface 84 of bottom plate 81.

In addition, pattern definition mask 12 is located within recessed area 29 and covers a portion of holes 83 in bottom plate 81. A pliable sheet 82 is held to bottom surface 84 of bottom plate 16 by a vacuum in recessed area 29. Alternatively, pliable sheet 82 could be held by an adhesive (not shown) to bottom surface 84. Pliable sheet 82 is large enough to cover all holes 83. It should be noted that pliable sheet 82 is not flat, but rather has dome regions 79 that are located on pliable sheet 82 to correspond with each hole 83 in bottom plate 81. Dome regions 79A are formed areas of pliable sheet 82 that extend away from bottom surface 84 of bottom plate 81. The letter "A" has been appended to reference number 79 to distinguish a subset of dome regions 79 that are covered by pattern definition mask 12. In other words, pattern definition mask 12 and dome regions 79A cover corresponding ends of holes 83.

In operation, a vacuum in recessed area 29 causes a portion of dome regions 79B to become inverted. Dome regions 79B extend from bottom surface 84 into holes 83 in bottom plate 81. The letter "B" has been appended to reference number 79 to distinguish a subset of dome regions that are not covered by pattern definition mask 12. In other words, pattern definition mask 12 does not cover holes 83 where dome regions 79B are located. Thus, pattern definition mask 12 defines a pattern of dome regions 79A that extend below bottom surface 84. In addition, pattern definition mask 12 defines a pattern of dome regions 79B that become inverted and do not extend below bottom surface 84.

FIG. 8 illustrates the relationship between flux transport head 80 of FIG. 7 and a substrate 44. Top plate 18 is shown secured to bottom plate 81 by threaded bolts 20 extending through holes 22 in top plate 18. A plurality of holes 83 are covered by pliable sheet 82. Flux transport head 80 is positioned above substrate 44. Substrate 44 includes a plurality of bonding pads 46A, 46B, and 46C formed on a surface of substrate 44. The letters "A" and "B" have been appended to reference number 44 to indicate that substrate 44 can be singulated into segments 44A and 44B. In addition, the letter "A" has been appended to reference number 46 to indicate bonding pads 46A that are formed on substrate 44A. The letter "B" has been appended to reference number 46 to indicate bonding pads 46B that are formed on substrate 44B.

Holes 83 in bottom plate 81 as well as bonding pads 46A and 46B on substrate 44 all have a fixed pitch. It should be noted that bonding pads 46A adjacent to bonding pads 46B are separated by the fixed pitch distance or by a value equal to the product of an integer multiple and the pitch distance. It should be understood that the two adjacent bonding pads may be located in the same row or the same column, i.e., bonding pads 46A, 46B, and 46C have a pitch of about one millimeter. The pitch of bonding pads 46A, 46B, and 46C is not limited to one millimeter.

Pattern definition mask 12 defines a pattern of dome regions 79A (FIG. 7) that extend below bottom surface 84 of flux transport head 80 and align to corresponding bonding pads 46A and 46B on substrate 44. Thus, flux transport head 80 can be lowered into a reservoir of a flux material (not shown) until the tips of dome regions 79A are coated with the flux material. Flux transport head 80 is positioned over substrate 44 and dome regions 79A contact bonding pads 46A and 46B and the flux material is deposited on bonding pads 46A and 46B contacted by dome regions 79A.

By now it should be appreciated that a structure and a method have been provided for transporting flux and solder balls to bond pad locations on a substrate of a semiconductor device. The present invention provides a transport head having specific masks that correspond to various sizes and differing Input/Output (I/O) pin counts of semiconductor devices. The transport tool and pattern definition mask are suitable for transporting flux and solder balls in the assembly process for Ball Grid Arrays (BGAs), Glob Top Arrays (GTAs), Pin Grid Arrays (PGAs), and the like. Because the transport tool and mask options can accommodate a variety of semiconductor devices, package tooling costs and package development cycle times are reduced.

What is claimed:

1. A transport apparatus, comprising:
   a holding structure having a major surface;
   first and second selector pins each having an extender rod and a body positioned on the major surface of the holding structure; and
   a mask held apart and below the major surface of the holding structure for preventing a tip of the extender rod of the first selector pin from extending below the mask, the mask further having an opening such that a tip of the extender rod of the second selector pin extends through the opening.

2. A transport apparatus, including:
   a structure having a major surface;
   first and second selector pins positioned on the major surface; and
   a mask positioned below the major surface of the structure that prevents an end of the first selector pin from extending past the mask, the mask further having an opening that allows an end of the second selector pin to extend beyond the mask.

3. The transport apparatus of claim 2, wherein the mask is attached to the structure.

* * * * *